(12) United States Patent
Yu et al.

(10) Patent No.: US 10,820,423 B2
(45) Date of Patent: Oct. 27, 2020

(54) FABRICATION METHOD OF CIRCUIT BOARD

(71) Applicant: Gold Circuit Electronics Ltd., Taoyuan (TW)

(72) Inventors: Chih-Hai Yu, Taoyuan (TW); Kuo-Wei Lo, Taoyuan (TW); Cheng-Hsiao Lin, Taoyuan (TW)

(73) Assignee: Gold Circuit Electronics Ltd., Taoyuan (TW)

( * ) Notice: Subject to any disclaimer, the term of this patent is extended or adjusted under 35 U.S.C. 154(b) by 211 days.

(21) Appl. No.: 15/680,196

(22) Filed: Aug. 17, 2017

(65) Prior Publication Data

US 2018/0376601 A1 Dec. 27, 2018

(30) Foreign Application Priority Data

Jun. 26, 2017 (TW) .............................. 106121255 A

(51) Int. Cl.
*H05K 3/00* (2006.01)
*H05K 3/46* (2006.01)
(Continued)

(52) U.S. Cl.
CPC ......... *H05K 3/0094* (2013.01); *H05K 3/0026* (2013.01); *H05K 3/0055* (2013.01); *H05K 3/0079* (2013.01); *H05K 3/064* (2013.01); *H05K 3/067* (2013.01); *H05K 3/125* (2013.01); *H05K 3/1208* (2013.01); *H05K 3/4053* (2013.01); *H05K 3/4644* (2013.01); *H05K 1/115* (2013.01); *H05K 2201/0959* (2013.01);
(Continued)

(58) Field of Classification Search
CPC .. H05K 3/0026; H05K 3/0055; H05K 3/0079; H05K 3/1208; H05K 3/125; H05K 3/4053; H05K 1/115; H05K 2203/054; H05K 2203/085; H05K 2203/107; H05K 2201/0959; H05K 2201/09827; H05K 3/064; H05K 3/067; H05K 3/0094; H05K 3/4644; Y10T 29/49165
See application file for complete search history.

(56) References Cited

U.S. PATENT DOCUMENTS 6,984,583 B2  1/2006  Farnworth
7,030,010 B2  4/2006  Farnworth et al.
(Continued)

FOREIGN PATENT DOCUMENTS

CN    103917060         7/2014
JP    2009182284 A  *  8/2009
(Continued)

OTHER PUBLICATIONS

Machine Translation (English) of TW 200948236, May 2019.*
(Continued)

*Primary Examiner* — A. Dexter Tugbang
(74) *Attorney, Agent, or Firm* — JCIPRNET

(57) ABSTRACT

A fabrication method of a circuit includes drilling holes in a substrate, so as to form a plurality of first opening holes and second opening holes in the substrate. A cover film is attached onto the substrate, so as to cover the first opening holes and the second opening holes. A portion of the cover film covering the first opening holes is removed, so as to expose the first opening holes. The first opening holes are filled.

6 Claims, 5 Drawing Sheets

(51) Int. Cl.
  *H05K 1/11* (2006.01)
  *H05K 3/40* (2006.01)
  *H05K 3/12* (2006.01)
  *H05K 3/06* (2006.01)

(52) U.S. Cl.
  CPC ............ *H05K 2201/09827* (2013.01); *H05K 2203/054* (2013.01); *H05K 2203/085* (2013.01); *H05K 2203/107* (2013.01); *Y10T 29/49165* (2015.01)

(56) References Cited

U.S. PATENT DOCUMENTS

| | | | | |
|---|---|---|---|---|
| 2003/0074790 A1* | 4/2003 | Ito | ................ | H05K 3/0094 29/852 |
| 2003/0124757 A1* | 7/2003 | Lee | ................ | H05K 3/0079 438/48 |
| 2004/0009335 A1* | 1/2004 | Kojima | ................ | H05K 3/0094 428/209 |
| 2005/0285147 A1* | 12/2005 | Usui | ................ | H05K 3/4644 257/202 |
| 2007/0232051 A1* | 10/2007 | Wang | ................ | H05K 3/3452 438/612 |
| 2011/0086309 A1* | 4/2011 | Nankawa | ................ | H05K 3/064 430/270.1 |
| 2013/0342592 A1* | 12/2013 | Merz | ................ | H05K 3/125 347/2 |

FOREIGN PATENT DOCUMENTS

| | | |
|---|---|---|
| TW | 200948236 | 11/2009 |
| TW | 201212763 | 3/2012 |
| TW | 201316858 | 4/2013 |

OTHER PUBLICATIONS

Machine Translation of Japanese Patent Publication, JP 2009-182284, Sep. 2019 (Year: 2019).*

"Office Action of Taiwan Counterpart Application", dated Feb. 9, 2018, p. 1-p. 7.

* cited by examiner

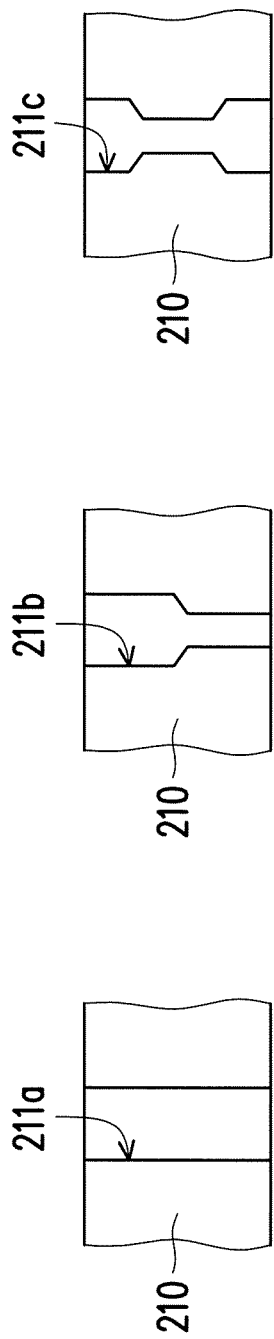
FIG. 3A
FIG. 3B
FIG. 3C
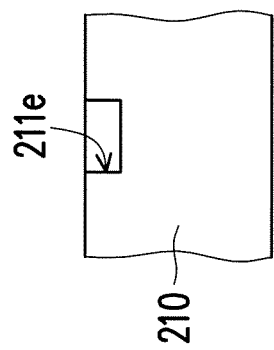
FIG. 3D
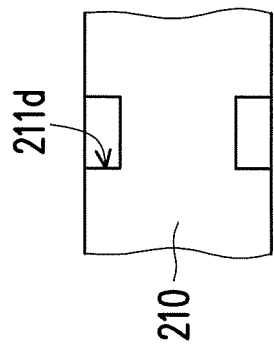
FIG. 3E

FABRICATION METHOD OF CIRCUIT BOARD

CROSS-REFERENCE TO RELATED APPLICATION

This application claims the priority benefit of Taiwan application serial no. 106121255, filed on Jun. 26, 2017. The entirety of the above-mentioned patent application is hereby incorporated by reference herein and made a part of this specification.

BACKGROUND OF THE INVENTION

Field of the Invention

The invention relates to a fabrication method, and particularly to a fabrication method of a circuit board.

Description of Related Art

In a conventional fabrication process of a printed circuit board (PCB), a hole-filling process can be carried out in two ways, including a vertical full-board via-plugging method and a horizontal selective via-plugging method. However, the two methods as mentioned above have shortcomings and technical problems respectively. For example, the vertical full-board via-plugging method is not applicable to the situation where the holes are to be filled selectively. It is required to complete drilling and filling all of the holes first, and the holes that do not need to be filled are drilled afterwards. As a result, the conventional vertical full-board via-plugging method is performed with complicated steps and takes too much fabrication time. On the other hand, although the horizontal selective via-plugging method is applicable to the situation where the opening holes of the PCB are to be filled selectively so as to reduce the unnecessary drilling step, with such method, since the ink coated on the board surface is so much that too much ink flows into the holes that are not to be filled, causing the products to be scrapped. Moreover, the too much ink makes it difficult to desmear after the PCB is fabricated as well as brings trouble in subsequent processes, and the risk of scrapping final product is also increased. Therefore, how to effectively improve the via-plugging process in the fabrication process of the PCB has been an important issue of the field.

SUMMARY OF THE INVENTION

The invention provides a fabrication method of a circuit board, which can effectively improve the efficiency and quality of via-plugging process for a circuit board.

A fabrication method of circuit board of the invention includes drilling holes in a substrate so as to form a plurality of first opening holes and a plurality of second opening holes. A cover film is attached onto the substrate so as to cover the first opening holes and the second opening holes. A portion of the cover film covering the first opening holes is removed so as to expose the first opening holes. The first opening holes are filled.

In one embodiment of the invention, the fabrication method further includes removing the rest of the cover film after the first opening holes are filled.

In one embodiment of the invention, the fabrication method further includes performing a desmearing step on a surface of the substrate after removing the rest of the cover film.

In one embodiment of the invention, the cover film includes a laser gasified film.

In one embodiment of the invention, the method of removing a portion of the cover film covering the first opening holes includes laser ablation.

In one embodiment of the invention, the first opening holes and the second opening holes include a through-hole, a back-drill hole, a dumbbell-shaped hole, a double-sided laser hole or a laser hole.

In one embodiment of the invention, the method of filing the first opening holes includes a horizontal via-plugging method or a vertical via-plugging method.

In one embodiment of the invention, the method of drilling holes in the substrate includes a laser-drilling method.

In one embodiment of the invention, the first opening holes and the second opening holes are identical.

In one embodiment of the invention, before attaching the cover film onto the substrate, a step of vacuuming a cavity where the substrate is located is further included.

In summary, according to the fabrication method of the circuit board described in the embodiments of the invention, the substrate has first opening holes and second opening holes. The cover film is attached onto the substrate so as to cover the first opening holes and the second opening holes. In the embodiments of the invention, a portion of the cover film covering the first opening holes may be selectively removed so as to expose the first opening holes, and the second opening holes remain covered by the cover film. Therefore, when the first opening holes are filled, the ink filled into the first opening holes does not further filled into the second opening holes. Accordingly, the fabrication method of the circuit board in the embodiments of the invention is applicable to selectively fill the opening holes in the substrate so as to save steps and time of via-plugging process, thereby improving the quality of via-plugging process and fabrication of the overall circuit board.

In order to make the aforementioned features and advantages of the invention more comprehensible, embodiments accompanying figures are described in detail below.

BRIEF DESCRIPTION OF THE DRAWINGS

FIGS. 3A to 3E are schematic views of opening holes in a substrate according to another embodiment of the invention.

DESCRIPTION OF EMBODIMENTS

Figure 1A:
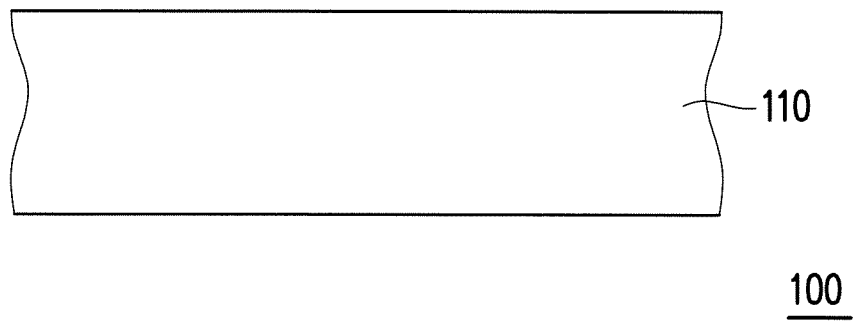
FIGS. 1A to 1F are schematic views of a fabrication method of a circuit board according to an embodiment of the invention.
Figure 1B:
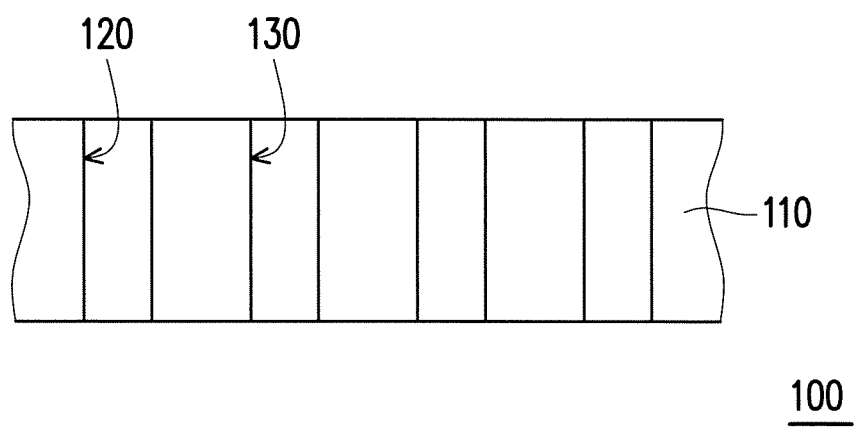
Figure 1C:
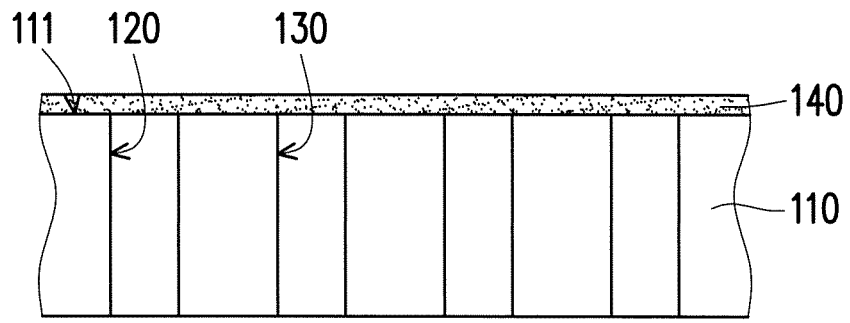
Figure 1D:
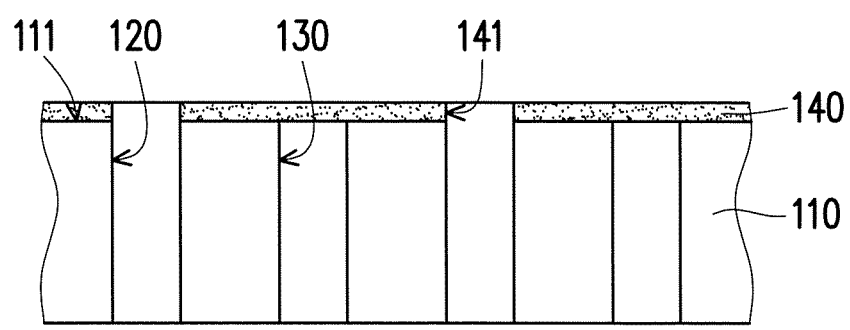
Figure 1E:
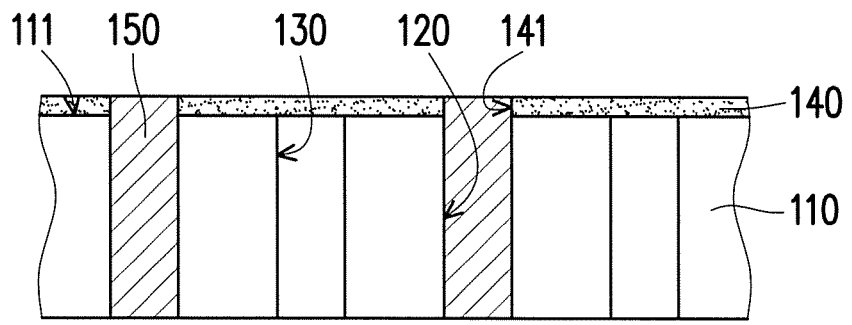

FIGS. 1A to 1F are schematic views of a fabrication method of a circuit board according to an embodiment of the invention. FIG. 2 is a flow chart illustrating a fabrication method of a circuit board according to an embodiment of the invention. Referring to FIGS. 1A to 1F and FIG. 2, in the embodiment, as shown in FIG. 1A, a fabrication method of a circuit board 100 includes providing a substrate 110 (step 201 in FIG. 2). Next, as shown in FIG. 1B, the substrate 110 is drilled so as to form a first opening hole 120 and a second opening hole 130 in the substrate 110 (step 202 in FIG. 2). Afterwards, as shown in FIG. 1C, a cover film 140 is attached onto a surface 111 of the substrate 110 so as to cover the first opening hole 120 and the second opening hole 130

(step 203 in FIG. 2). Then, as shown in FIG. 1D, a portion of the cover film 140 covering the first opening hole 120 is removed to expose the first opening hole 120 (step 204 in FIG. 2). Subsequently, as shown in FIG. 1E, the exposed first opening hole 120 is filled by filling a plugging ink 150 into the first opening hole 120 (step 205 in FIG. 2). In the embodiment, the via-plugging step is performed by coating the plugging ink 150 uniformly onto the cover film 140, and plugging ink 150 may be filled into the first opening hole 120 via an opening 141 that is formed after the portion of the cover film 140 is removed.

Figure 1F:
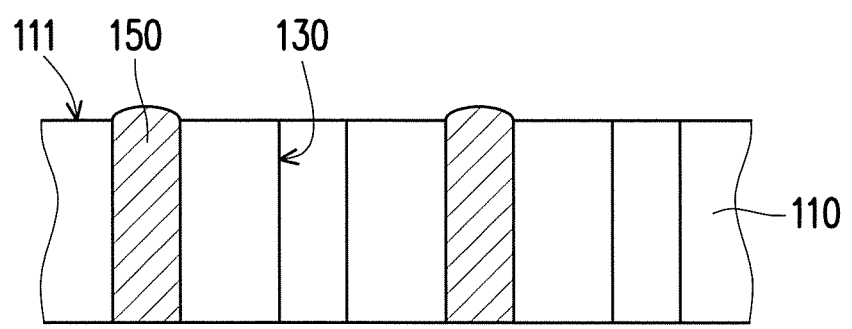
Figure 2:
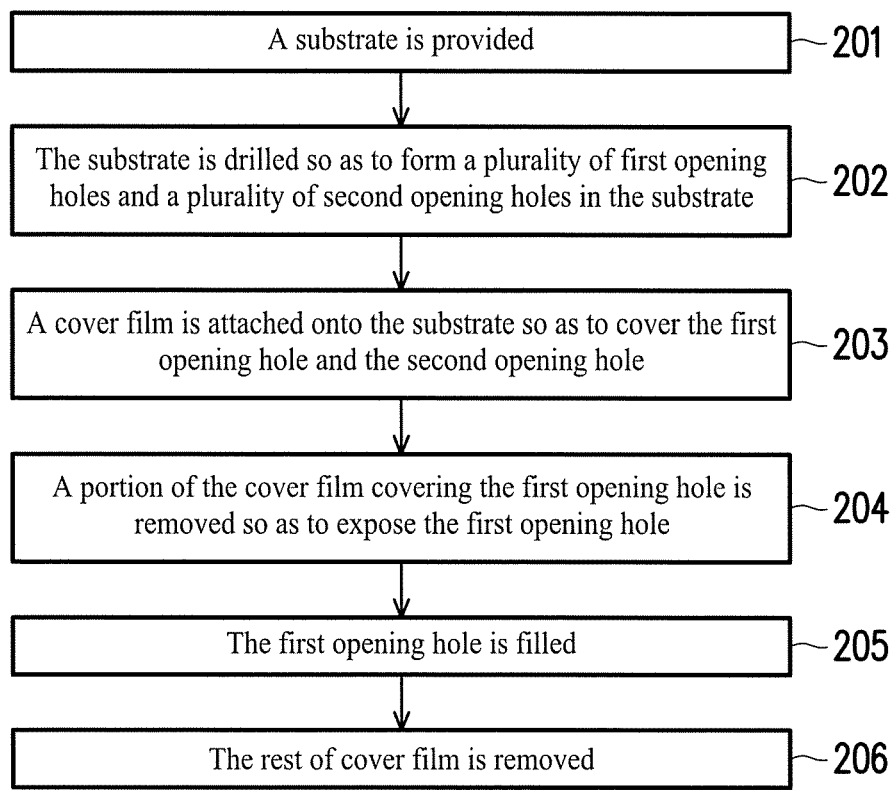
FIG. 2 is a flow chart illustrating a fabrication method of a circuit board according to an embodiment of the invention.

After the via-plugging step is completed, as shown in FIG. 1F, the rest of cover film 140 may be removed completely from the surface 111 of the substrate 110 (step 206 in FIG. 2). In the embodiment, the cover film 140 is, for example, a laser gasified film, and the portion of the cover film 140 on the first opening hole 120 may be removed via, for example, a laser ablation method so as to form the opening 141. In addition, after the via-plugging step for the first opening hole 120 is completed, the rest of cover film 140 attached to the surface 111 of the substrate 110 may be completely removed via a peel-off method. In the meantime, during the process of peeling off the cover film 140, the extra plugging ink 150 overflowing from the opening 141 during the via-plugging process can be removed at the same time.

In the embodiment, after the first opening hole 120 and the second opening hole 130 are formed in the substrate 110, before the via-plugging step is conducted, an electroplating process may be performed to the first opening hole 120 and the second opening hole 130.

In the embodiment, the substrate 110 may be placed in, for example, a vacuumed cavity (not shown). The vacuumed cavity may be vacuumed after the first opening hole 120 and the second opening hole 130 are formed in the substrate 110 to prevent bubbles from being generated in the plugging ink 150 when performing the via-plugging process to the first opening hole 120 so as to avoid that the plugging ink 150 is deteriorated or broken in the subsequent curing process and causes the product to be scrapped.

In the fabrication method of the circuit board 100 of the embodiment, the first opening hole 120 is filled to serve an example for description. In another embodiment that is not shown, the second opening hole 130 may be filled selectively. The invention provides no limitation thereto. In addition, in embodiments, the form of the first opening hole 120 and the second opening hole 130 may be identical or different.

In the embodiment, the via-plugging process for the first opening hole 120 or the second opening hole 130 of the circuit board 100 may be performed in a vertical or horizontal manner. When the substrate 110 is configured in a vertical manner relative to the plane where the substrate is located, after the cover film 140 is attached onto the surface 111 of the substrate 110, a portion of the cover film 140 on the first opening hole 120 or the second opening hole 130 may be ablated selectively via a laser ablation method, and the opening holes that do not need to be filled may remain covered by the rest of the cover film 140. As compared with the conventional vertical full-board via-plugging method, the fabrication method of the circuit board 100 of the embodiment can effectively reduce the number of times of repeatedly drilling and filling holes and performing electroplating in the holes on the substrate 110, thereby improving the fabrication efficiency of the circuit board 100.

In the embodiment, when the substrate 110 is configured in a horizontal manner relative to the plane where the substrate is located, after the substrate 110 is drilled so as to fonn the first opening hole 120 and the second opening hole 130, the surface 111 of the entire substrate 110 may be covered via the cover film 140. Next, the cover film 140 that covers the first opening hole 120 or the second opening hole 130 to be filled is ablated also via the laser ablation method so as to form the opening 141. As a result, the first opening hole 120 or the second opening hole 130 to be filled can be effectively exposed, and the first opening hole 120 or the second opening hole 130 that are not to be filled may remain covered by the rest of the cover film 140. Accordingly, in the via-plugging process, no matter how many times the via-plugging step is performed, the extra ink does not flow into the adjacent first opening hole 120 or the second opening hole 130 that is not to be filled. Therefore, there is no need to leave a larger gap between the first opening hole 120 and the second opening hole 130 adjacent to each other to prevent the plugging ink 150 from overflowing into the adjacent opening hole that is not to be filled.

In the embodiment, a gap between the first opening hole 120 and the second opening hole 130 is, for example, 10 mils in size. In addition, in the embodiment, during the horizontal via-plugging process, there is no need to fabricate a screen plate additionally to cover the first opening hole 120 or the second opening hole 130 that is not to be filled, thereby effectively reducing the operation time and cost of the via-plugging process.

Moreover, in the horizontal via-plugging process, the plugging ink 150 for coating can be uniformly dispensed into each opening hole via the cover film 140 attached onto the substrate 110 to avoid too much plugging ink 150 from flowing into and gathering in specific first opening holes 120 or second opening holes 130 to cause ink explosion.

After the whole via-plugging process is completed, the rest of cover film 140 on the surface 111 of the substrate 110 may be peeled off. Meanwhile, the extra ink that is left on the cover film 140 during the via-plugging process can be removed simultaneously while the cover film 140 is peeled off from the surface 111 of the substrate 110. By doing so, it can be avoided to perform a plurality times of rubbing on the surface 111 of the substrate 110 prior to performing desmearing operation on the surface 111 of the substrate 110 so as to remove the extra plugging ink 150.

Referring to FIG. 2 again, after step 206 is completed, that is, after the rest of cover film 140 left on the surface 111 of the substrate 110 is removed, the desmearing process may be performed to the surface 111 of the substrate 110.

FIG. 3A to FIG. 3E are schematic views of opening holes in a substrate according to another embodiment of the invention. In the embodiment, the form of opening holes in a substrate 210 may be a through-hole 211a in FIG. 3A, a back-drill hole 211b in FIG. 3B, a dumbbell-shaped hole 211c in FIG. 3C, a double-sided laser hole 211d in FIG. 3D and/or a laser hole 211e in FIG. 3E. In the embodiment, the opening holes in the substrate 210 may be in the same or different forms. That is to say, in the embodiment, the form of the opening hole in the substrate 210 and the configuration thereof may be properly adjusted depending on the actual demand of the subsequent via-plugging process.

In summary, according to the embodiments of the invention, the substrate may be drilled so as to form the first opening hole and the second opening hole at the same time. The surface of the substrate with the first opening hole and the second opening hole may be covered by the cover film which is, for example, a laser gasified film. Next, a portion of the cover film covering the first opening hole or the second opening hole that is to be filled may be removed selectively so as to form the opening in the cover film. The opening corresponds to the first opening hole or the second opening hole that is to be filled. According to the embodiments of the invention, the cover film may be removed via the laser ablation method. After the portion of the cover film on the first opening hole or the second opening hole to be filled is removed, the plugging ink may be coated uniformly on the cover film, and the plugging ink may be filled into the first opening hole or the second opening hole via the opening. Furthermore, after the via-plugging process is completed, the rest of cover film covering the surface of the substrate may be removed. When the cover film is removed, the plugging ink overflowing onto the surface of the cover film in the via-plugging process may be taken away simultaneously so that the plugging ink is not left on the surface of the substrate.

In the embodiments of the invention, the via-plugging method can decrease the number of times of performing filling and drilling holes repeatedly as well as reducing the complexity and time consumption of the overall fabrication process. In the meantime, since the opening hole that is not to be filled may be covered by the cover film during the via-plugging process, the extra plugging ink does not flow into the opening hole that is not to be filled and causes the product to be scrapped in the subsequent process. Accordingly, the gap between the opening holes adjacent to each other may be further shortened so that more opening holes can be accommodated in the substrate with the same unit area, thereby effectively increasing the density of the opening hole forming in the substrate. Furthermore, the extra plugging ink can be removed while the cover film on the substrate is peeled off, so that the desmearing step that is required to be performed on the surface of the substrate can be reduced, thereby enhancing the quality of final product.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A fabrication method of a circuit board, comprising:
   drilling holes in a substrate, so as to form a plurality of first opening holes and a plurality of second opening holes in the substrate;
   placing the substrate in a vacuumed environment after drilling the first opening holes and the second opening holes in the substrate;
   attaching a cover film onto the substrate, so as to cover the first opening holes and the second opening holes, wherein the cover film comprises a laser gasified film;
   removing a portion of the cover film covering the first opening holes through a laser ablation method sequentially after attaching the cover film onto the substrate, so as to expose the first opening holes;
   filling the first opening holes exposed through the portion of the cover film; and
   removing the rest of the cover film covering the substrate and the second opening holes by a peel-off method after filling the first opening holes exposed through the portion of the cover film.

2. The fabrication method according to claim 1, further comprising performing a desmearing step on a surface of the substrate after the rest of the cover film is removed.

3. The fabrication method according to claim 1, wherein the first opening holes and the second opening holes comprise a through-hole, a back-drill hole, a dumbbell-shaped hole, a double-sided laser hole or a laser hole.

4. The fabrication method according to claim 1, wherein a method for filling the first opening holes comprises a horizontal via-plugging method or a vertical via-plugging method.

5. The fabrication method according to claim 1, wherein a method of drilling the substrate comprises a laser drilling method.

6. The fabrication method according to claim 1, wherein the first opening holes and the second opening holes are identical.

* * * * *